United States Patent [19]

Soclof

[11] 4,379,307
[45] Apr. 5, 1983

[54] INTEGRATED CIRCUIT CHIP TRANSMISSION LINE

[75] Inventor: Sidney I. Soclof, San Gabriel, Calif.

[73] Assignee: Rockwell International Corporation, El Segundo, Calif.

[21] Appl. No.: 160,031

[22] Filed: Jun. 16, 1980

[51] Int. Cl.³ .......................................... H01L 27/04
[52] U.S. Cl. ........................................ 357/68; 357/40; 357/55; 357/65; 357/71; 333/236; 333/238
[58] Field of Search ................. 333/236, 238; 357/40, 357/55, 56, 60, 45, 51, 65, 68, 69, 71, 84

[56] References Cited

U.S. PATENT DOCUMENTS

| | | | |
|---|---|---|---|
| 3,343,256 | 9/1967 | Smith et al. | 357/68 |
| 3,372,070 | 3/1968 | Zuk | 357/68 |
| 3,539,705 | 11/1970 | Nathanson et al. | 357/68 |
| 3,566,214 | 2/1971 | Usuda | 357/68 |
| 3,648,131 | 3/1972 | Stuby | 357/68 |
| 3,715,631 | 2/1973 | Beneking | 357/68 |
| 3,787,252 | 1/1974 | Filippazzi et al. | 357/68 |
| 3,813,585 | 5/1974 | Tarui et al. | 357/55 |
| 3,890,636 | 6/1975 | Harada et al. | 357/69 |
| 3,896,473 | 7/1975 | DiLorenzo et al. | 357/69 |
| 4,229,717 | 10/1980 | Krone | 357/14 |

*Primary Examiner*—William D. Larkins
*Attorney, Agent, or Firm*—H. Fredrick Hamann; Wilfred G. Caldwell

[57] ABSTRACT

The invention includes methods and apparatus for providing relatively long conductors on integrated chips with substantially reduced RC time constants. The preferred mode utilizes a substrate having a metallization pattern wherein etching or milling into the substrate creates a cavity with a metallization conductor disposed in the mouth of the cavity, said cavity being metallized to provide the second conductor. A similar structure may be formed by utilizing orientation dependent etchant which attacks the (111) surface much quicker than the (100) surface to provide an etched V-shaped cavity wherein the first conductor is still an elongated metallization segment in the mouth of the V, and the V is metallized to provide the second conductor. Also, a single conductor, such as the elongated metallization strip may be extended to a conductor on the reverse side of the substrate by providing a pyramid shaped hole from the first conductor through the substrate, which hole is metallized to extend the first conductor to the second conductor via the hole in the substrate.

3 Claims, 15 Drawing Figures

INTEGRATED CIRCUIT CHIP TRANSMISSION LINE

BACKGROUND OF THE INVENTION

1. Field of the Invention

This invention relates to the field of establishing relatively long interconnections on integrated chips while reducing the RC time constant of such connections over present day connections.

2. Prior Literature

None known.

SUMMARY OF THE INVENTION

The method relates to the selective etching into a semiconductor substrate to isolate at least one elongated portion of a conductive coating to define a first conductor, and applying a further conductive coating to the etched substrate to comprise a second conductor in spaced relation to the first conductor. This may be achieved by using an orientation dependent etchant to provide a V-shaped groove with the first conductor in the mouth of the V. The substrate may have an elongated cavity etched therein from one side with a first conductor disposed in the mouth of the cavity and a second conductor coating the cavity; with the first conductor extending via a pyramidal pit through an etched hole to make contact with a metallization pattern. Thus, the apparatus comprises the completed product.

DESCRIPTION OF A PREFERRED EMBODIMENT

The purpose of the invention is to avoid the serious circuit performance problems due to the relatively large capacitance per unit area and the large resistant per unit length encountered in the longer innerconnections used in high speed integrated circuit chips. The large resistance per unit length is in part the result of the current return path in the silicon substrate. The combination of the large resistance and capacitance results in a large circuit time constant. This produces a large amount of signal attenuation, signal distortion, and a long propagation delay time. The subject arrangement produces long range innerconnections on an integrated chip having a much lower capacitance and resistance per unit length.

The primary loss mechanism for the conventional MOS type of innerconnection on silicon integrated chips is due to the RC time constant, wherein the capacitance can be reduced as well as the resistance by use of the constructions shown in the ensuing figures.

Principally, the capacitance is reduced as a result of the change from the silicon dioxide/silicon dielectric structure with dielectric constants of 3.8 and 11.8, respectively to air with the dielectric constant of 1. Also, the spacing is increased between the effective "plates".

The resistance is decreased i.e. series resistance by changing from silicon for the bottom (substrate) conductor with 0.01 to 1 ohm-centimeter resistivity to aluminum with approximately 3 micro ohms-centimeter resistivity. The shunt conductance is reduced from that due to the conductivity of silicon down to essentially zero i.e. the air dielectric.

The short range metallization innerconnections i.e., approximately 10 mils or less are accomplished in the usual processing of the IC side of the wafer. The long range metallization i.e. about 100 mils or greater may be accomplished on the back side of the wafer as described herein.

As seen in the preferred embodiment of FIGS. 10 through 15, grooves are etched on the back side of the wafer for the long range metallization. The back side is then subjected to a second metallization plus photoresist operation to produce a metallic coating inside the grooves and to build up the thickness of the center conductor. The back side may be almost fully metallized except for the small gaps required in the region of the etched through pyramid etched pits for electrical separation of contacts to the beam conductors from the substrate ground plane. The latter reduces the parasitic substrate resistance, which is a problem in conventional structure due to the RC time constants, feedback effects and crosstalk when there is all top contacts and no back surface metallization.

Figure 1:
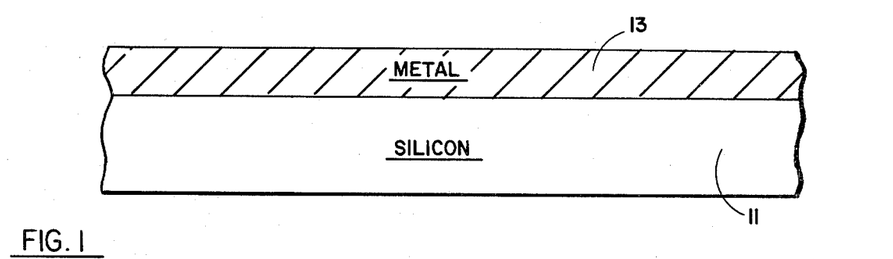
FIG. 1 shows the metallization of the silicon.
Figure 2:
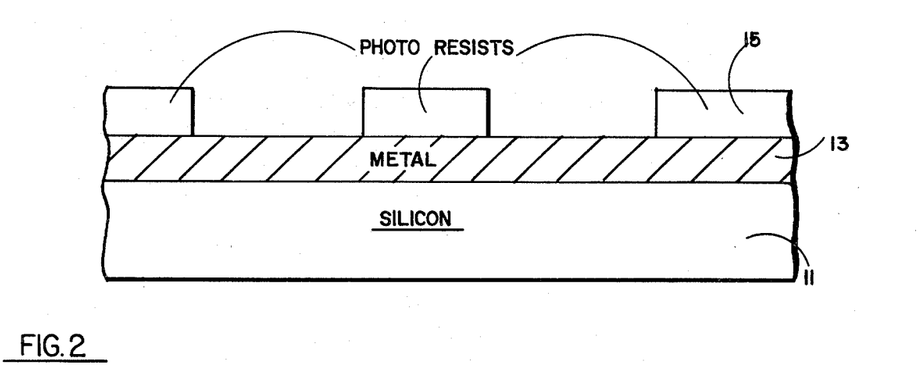
FIG. 2 discloses patterning of the photo resist.
Figure 3:
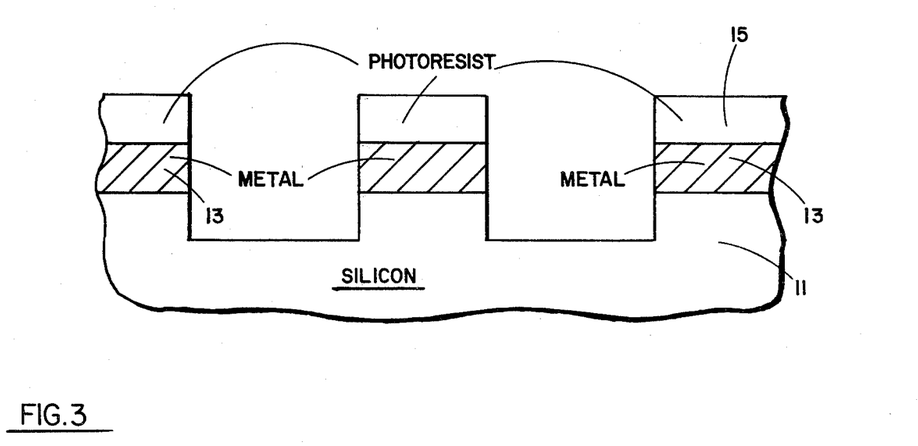
FIG. 3 shows the removal of the metal from the unprotected areas.

In FIG. 1 a silicon substrate 11 is covered with a layer of metal (e.g.) aluminum 13. A patterned photoresist 15 is applied over the aluminum 13, as shown in FIG. 2 and etching takes place in FIG. 3. It will be seen that not only is the aluminum layer 13 etched but also slots are etched into the silicon 11. Alternately, of course, ion milling could be employed in lieu of the etching. From FIG. 4 it may be seen that the process step of FIG. 3 merely defined the central aluminum conductor 17 which appears to be floating above the cavity 19 formed in the silicon 11 by etching the silicon further and then removing the photoresist 15.

Figure 4:
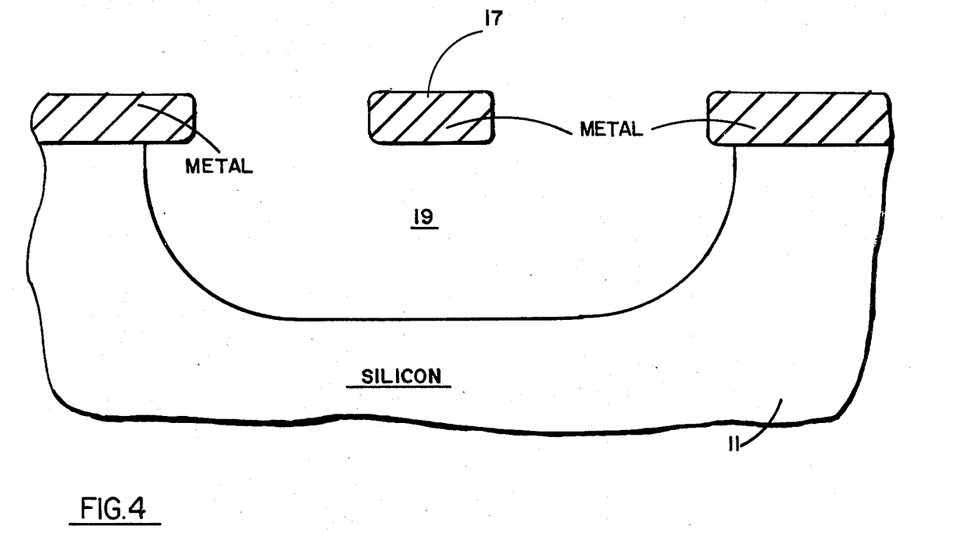
FIG. 4 shows an etching step which removes silicon to leave a metal conductor in the mouth of the cavity so formed.
Figure 9:
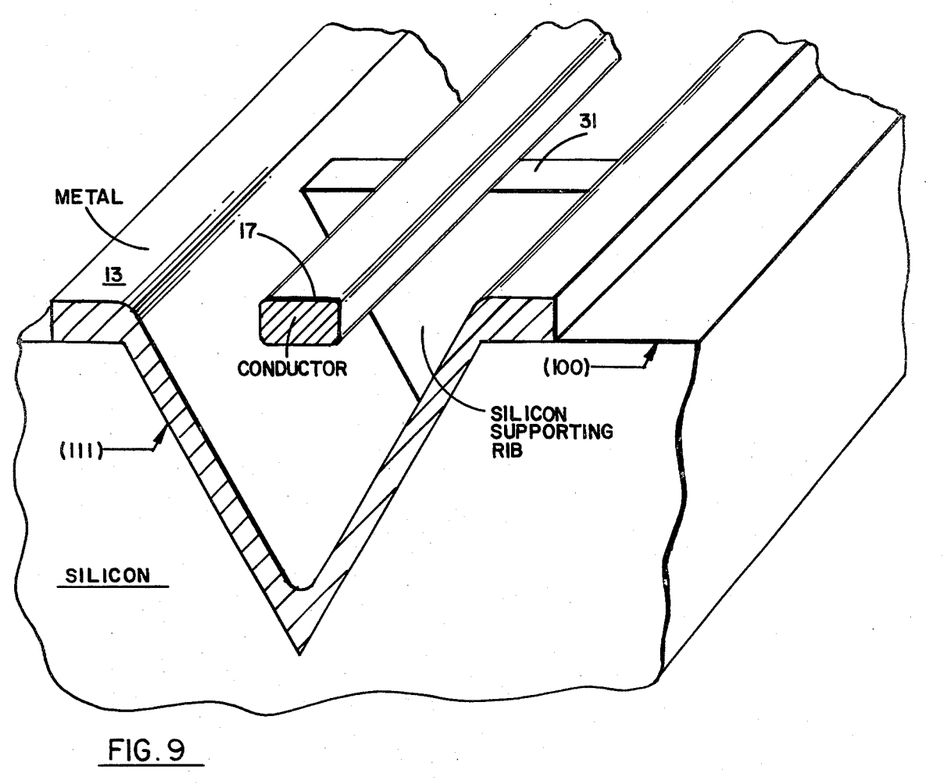
FIG. 9 shows the structure in perspective, better to illustrate the supporting of the central conductor.
Figure 15:
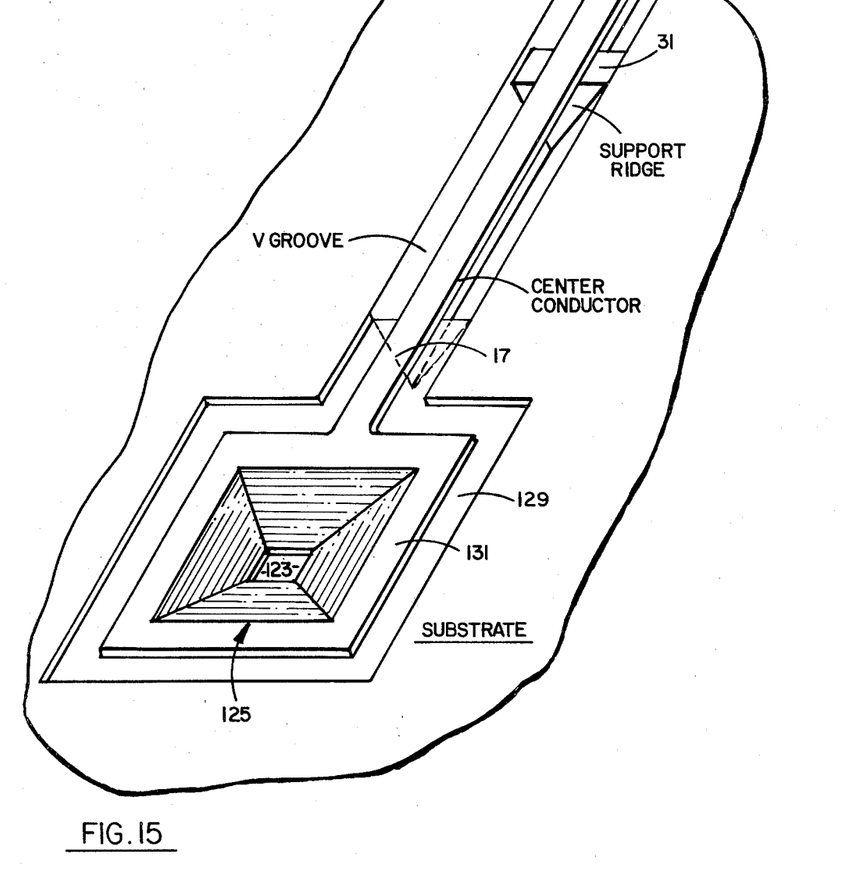
FIG. 15 is a perspective view from the rear side of the substrate, showing the center conductor connected via the pyramidal metallized etch pit to the front side of the substrate.

In reality the aluminum conductor 17 is supported by silicon webs (not shown) in FIG. 4 but visible in FIGS. 9 and 15.

Figure 5:
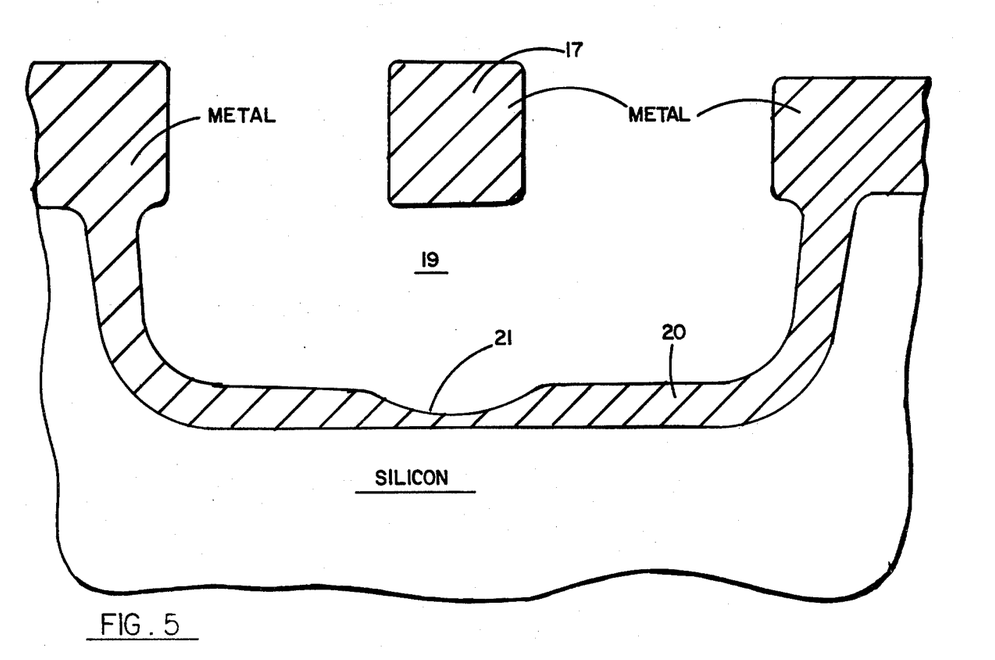
FIG. 5 shows the addition of metallization to the cavity.

FIG. 5 shows the structure of FIG. 4 with further aluminum deposited to coat the cavity 19 boundaries and also build up the conductor 17. A slight depression 21 is shown beneath the aluminum beneath 17 due to the shielding of the beam 17 from the source of aluminum for deposit.

From FIG. 5 it may be seen that one conductor may be beam 17 and the other coating 20 with an air dielectric therebetween, thereby reducing both the capacitive and resistive effects of this transmission line.

Figure 6:
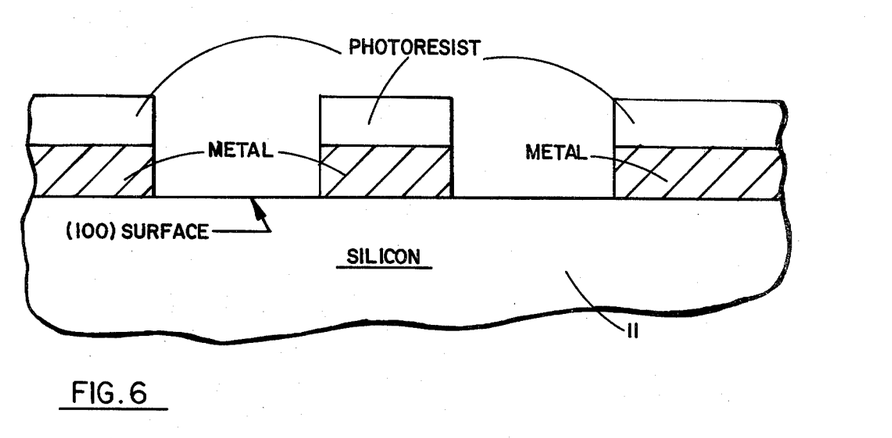
FIG. 6 shows a similar patterning step for a silicon substrate which has been metallized and patterned with photoresist.

A second embodiment of the invention is shown in FIGS. 6 through 8 wherein again the photoresist pattern is laid down on the silicon substrate 11 with the photoresist shown at 15 and the aluminum coating at 13.

Figure 7:
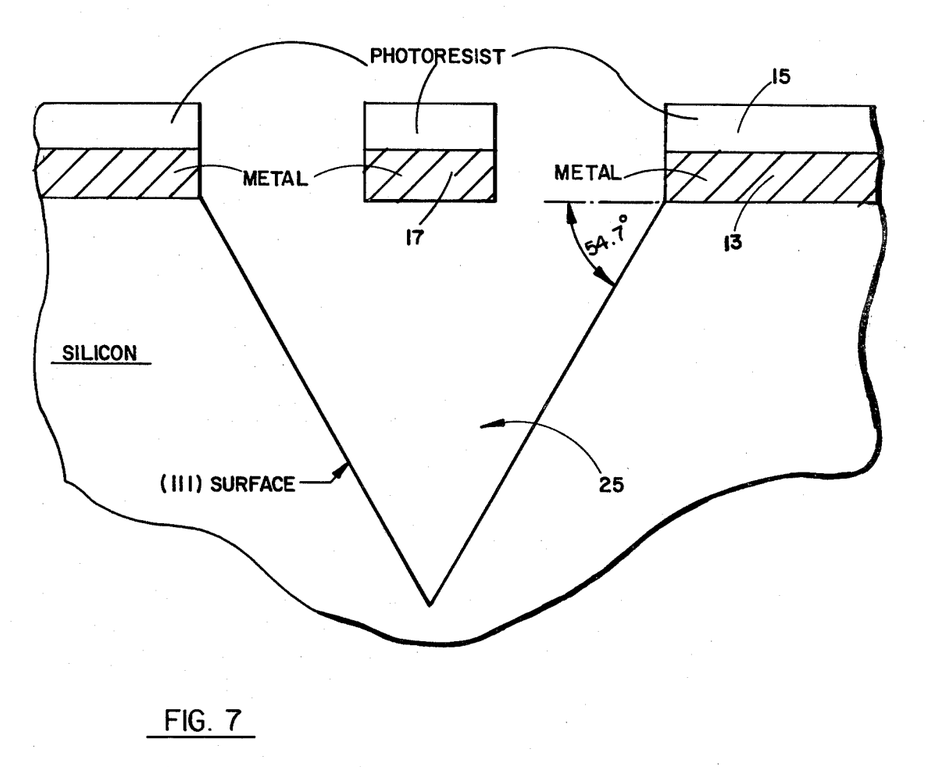
FIG. 7 shows the etching of a V-shaped groove or cavity through the use of orientation dependent etchant.

The difference arises in connection with the step of FIG. 7 wherein an orientation dependent etchant is utilized to generate the groove 25 because it attacks the crystallographic orientation plane (111) of silicon much slower than it attacks the plane (100). It may be seen that the groove provides an approximately 54.7 degree angle with respect to the original silicon (100) surface.

Figure 8:
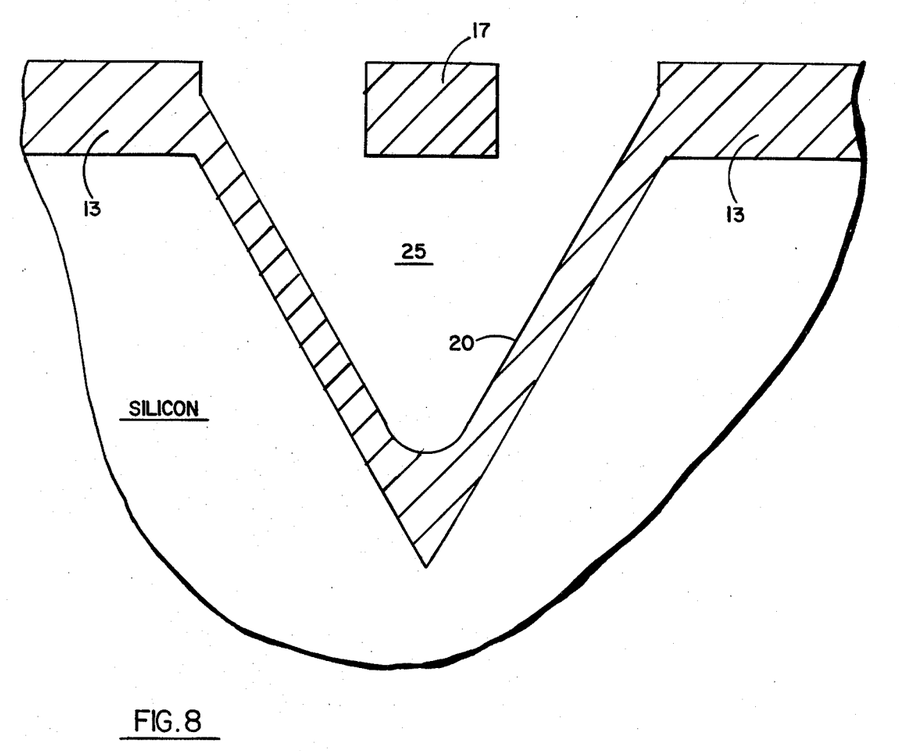
FIG. 8 shows the structure with a metallization coating applied to the V-shaped groove.

In FIG. 8 the photoresist 15 has been removed and metallization, including such material as aluminum has been deposited to line the V-shaped groove, as shown at 20.

Preferably, the aluminum deposition is done in an evaporator in which the aluminum evaporant flux is incident on the silicon wafers over a wide angular spread. This provides for a more uniform coating 20.

The aluminum beam 17 may be supported by silicon ridges at the ends or by intermediate webs of silicon.

This is better shown in FIG. 9 in the perspective view wherein the beam 17 is shown atop a silicon supporting web 31. The web 31 was protected by photoresist in the processing previously described.

In establishing the aluminum coating 20 the structure of FIG. 9 may be rotated about the source of aluminum in order to provide more uniform coating.

In order to conserve real estate on the very large scale integrated chip, the V groove coaxial metallization can be placed on the back side of the chip. Such an arrangement is the preferred embodiment as depicted in FIGS. 10 through 15, wherein the starting material is a (100) silicon substrate 101 e.g. P-type 101 of FIG. 10. This is of light to moderate doping and typically about 5 to 10 mils thick. A high concentration P+ diffusion is performed into this substrate and P+ layer on one side will be etched off, leaving a P+ over P structure, as shown.

Figure 10:
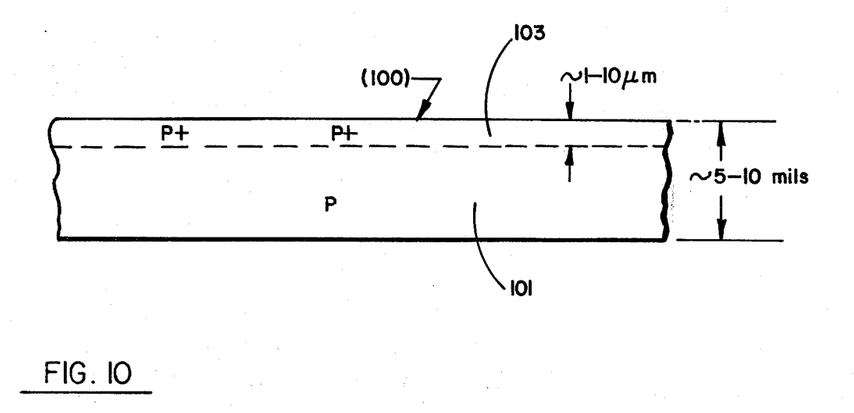
FIG. 10 shows the initial doping of a substrate for use in an arrangement utilizing both sides of the substrate for the transmission lines.

In FIG. 10 the P silicon remains and is shown at 101, and the P+ at 103. By way of example, the P+ region may have a thickness of approximately 1 to 10 micrometers whereas the overall substrate thickness may be of the order of 5 to 10 mils.

Figure 11:
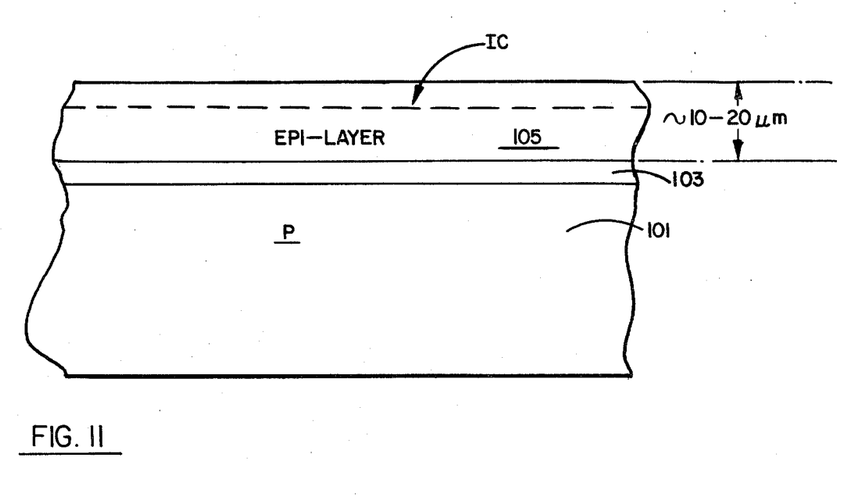
FIG. 11 shows the addition of an epi-layer for the integrated circuit processing in normal manner.

In FIG. 11 an epi-layer about 10 to 20 micrometers thick as shown at 105 is deposited on the P+ over P substrate and the normal I.C. processing is then undertaken to produce the I.C. circuit in the epi-layer as indicated at 105'. The region 105' is the complete I.C. circuitry but excluding the long range metallization pattern.

Figure 12:
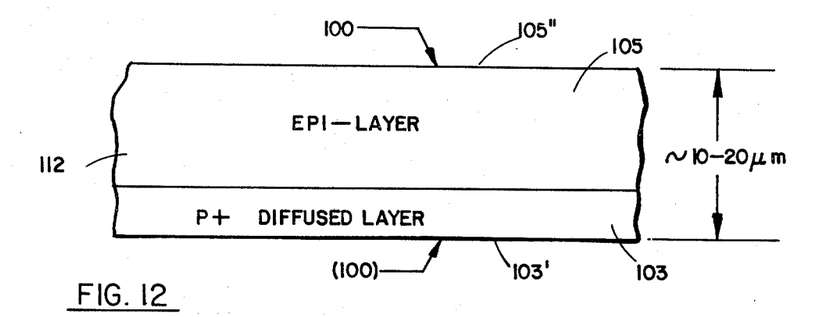
FIG. 12 shows the back side of the wafer as a P+ diffused layer.

The I.C. wafer is then subjected to a concentration dependent etchant with the I.C. side of the wafer coated with an etch resistant layer. As a result, the P type substrate 101 is etched away but the P+ diffused layer serves as an etch stop, as seen in FIG. 12. Thus, the resulting wafer 111 is thinned down as shown in FIG. 12.

Figure 13:
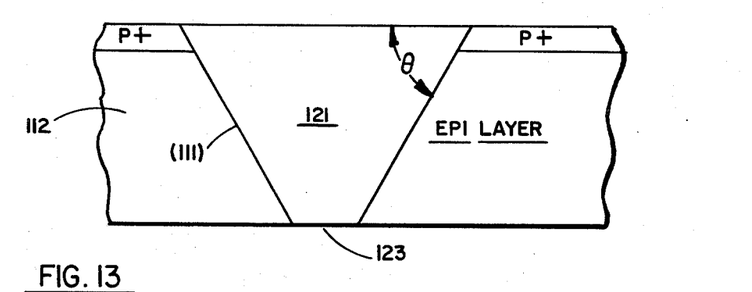
FIG. 13 shows the use of an orientation dependent etchant to develop the V groove from the reverse side of the substrate.

To progress from the structure of FIG. 12 to the structure of FIG. 13, the processing takes place on the back side of the wafer 111 and includes a conventional photoresist step using infrared illumination registration purposes to provide a series of square shaped openings in the P.R. layer. The front side of the wafer 105" is coated with an etch resistant layer. The back side 103' of wafer 112 is subjected to an orientation dependent etchant which etches the (111) planes at a rate much slower than the (100) planes. The etching proceeds through the wafer thickness to the top side, as shown in FIG. 3.

In this fashion a series of inverted pyramid-shaped etch pits are developed at selected positions along the wafer. A cross section of such a pit 121 is shown in FIG. 13. It includes a square opening 123 in the bottom of the wafer 112 and a square opening 125 in the top of the wafer 112.

Figure 14:
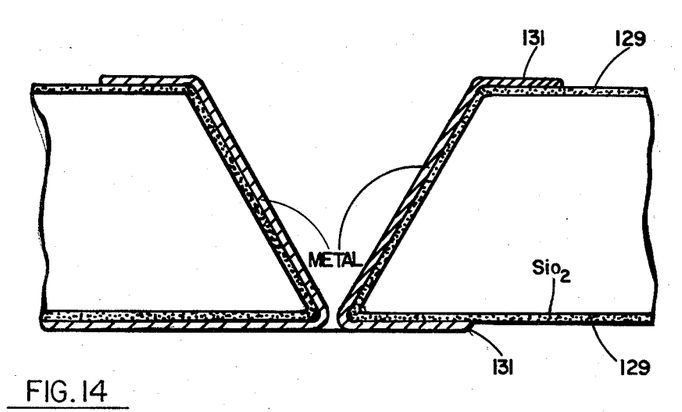
FIG. 14 shows metallization applied to both sides of the substrate and in connection therewith through the etch pit.

An oxide layer 129 is then grown (or deposited) on both sides of the wafer, as shown in FIG. 14. The metallization layer 131 is then deposited and defined by a photoresist process on both sides of the wafer so that contact is made through the etch hole 123 between the two sides of the wafer, as shown in FIG. 14. Thus contact is made through the etch hole 123 between the two sides of the wafer.

In FIG. 15, a perspective view shows the overall structure including the central conductor 17 supported by the silicon webs 31. Conductor 17 extends in metallization contact down through pyramidal etch pit 125 and out the lower square opening 123 to join the front conductor metallization. In this manner, the conductors may penetrate the wafer and the return path may extend along the back side of the wafer but not in silicon form rather in metallization form.

Having thus described a preferred embodiment of the invention what is claimed is:

1. An integrated chip interconnection which substantially reduces the RC time constant over current interconnections, comprising:
   a substrate having an elongated cavity etched therein;
   a conductive coating along said cavity to comprise a first conductor; and,
   a second conductor in spaced apart relation with said cavity and generally disposed in the mouth thereof, being formed from a metal layer applied to said substrate and etched through to form said cavity.

2. A chip of claim 1 further comprising:
   chip webs supporting said second conductor at spaced apart locations there along.

3. A silicon integrated chip equipped with relatively long transmission lines exhibiting low RC time constants comprising:
   a substrate having an elongated cavity etched therein from one side;
   a first conductor disposed in the mouth of the cavity;
   a second conductor in the other side of the substrate; and;
   pyramidal shaped openings from said one side to said other side having a conductive coating connection said conductors.

* * * * *

UNITED STATES PATENT AND TRADEMARK OFFICE
CERTIFICATE OF CORRECTION

PATENT NO. : 4,379,307
DATED : April 5, 1983
INVENTOR(S) : Sidney I. Soclof

It is certified that error appears in the above-identified patent and that said Letters Patent are hereby corrected as shown below:

Column 4, line 16, change [3] to read --13--.

Signed and Sealed this

Fourteenth Day of June 1983

[SEAL]

Attest:

DONALD J. QUIGG

Attesting Officer

Acting Commissioner of Patents and Trademarks